(12) United States Patent
Ng et al.

(10) Patent No.: US 8,022,769 B2
(45) Date of Patent: Sep. 20, 2011

(54) SEMICONDUCTOR DEVICE

(75) Inventors: Choon Yong Ng, Kawasaki (JP);
Kazutaka Takagi, Kawasaki (JP);
Naotaka Tomita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/780,280

(22) Filed: May 14, 2010

(65) Prior Publication Data

US 2011/0018631 A1   Jan. 27, 2011

(30) Foreign Application Priority Data

Jul. 27, 2009  (JP) ................. 2009-174003

(51) Int. Cl.
*H03F 3/68* (2006.01)
(52) U.S. Cl. ............... 330/295; 330/302; 330/305
(58) Field of Classification Search .......... 330/295, 330/124 R, 84, 286, 302, 305
See application file for complete search history.

(56) References Cited

U.S. PATENT DOCUMENTS

| | | |
|---|---|---|
| 5,694,085 A | 12/1997 | Walker |
| 6,201,445 B1 * | 3/2001 | Morimoto et al. ............ 330/295 |
| 6,727,761 B1 * | 4/2004 | Apel ............................. 330/295 |
| 7,286,018 B2 * | 10/2007 | Makihara et al. ............. 330/295 |
| 7,348,852 B1 * | 3/2008 | Ozard ........................... 330/296 |
| 2007/0229188 A1 | 10/2007 | Takagi |
| 2010/0073099 A1 | 3/2010 | Ng et al. |

FOREIGN PATENT DOCUMENTS

| | | |
|---|---|---|
| DE | 10 2009 017 360 A1 | 4/2010 |
| JP | 2006-108385 | 4/2006 |
| KR | 10-2001-00213 53 | 3/2001 |

OTHER PUBLICATIONS

U.S. Appl. No. 12/551,981, filed Sep. 1, 2009, Kazutaka Takagi.
Office Action (with English translation) issued on May 27, 2011, in countpart Korean Application No. 10-2010-44377 (6 pages).

* cited by examiner

*Primary Examiner* — Hieu Nguyen
(74) *Attorney, Agent, or Firm* — Oblon, Spivak, McClelland, Maier & Neustadt, L.L.P.

(57) ABSTRACT

According to one embodiment, there is a semiconductor device including a first active element, a second active element connected in parallel with the first active element, and a first stabilization circuit connected between a gate of the first active element and a gate of the second active element and configured with a parallel circuit of a gate bypass resistor, a gate bypass capacitor, and a gate bypass inductor, the first stabilization circuit having a resonant frequency equal to an odd mode resonant frequency.

18 Claims, 8 Drawing Sheets

SEMICONDUCTOR DEVICE

CROSS REFERENCE TO RELATED APPLICATION

This application is based upon and claims the benefit of priority from prior Japanese Patent Application No. P2009-174003 filed on Jul. 27, 2009, the entire contents of which are incorporated herein by reference.

FIELD

Embodiments described herein relate generally to a semiconductor device.

BACKGROUND

There are some types of transistors or amplifiers using Group-III to Group-V compound semiconductors such as a GaAsMESFET (Gallium Arsenide Metal Semiconductor Field Effect Transistor), GaAspHEMT (Gallium Arsenide p channel High Electron Mobility Transistor), and InPHEMT (Indium Phosphide High Electron Mobility Transistor), and susceptive to high-frequency oscillations due to a negative resistance appearing in a drain end output, known as a Gunn oscillation. Such the Gunn oscillation is applicable as an oscillation source of microwaves or millimeter waves, but undesirable for performances of power amplifiers to be stable and highly efficient.

In such applications using a single FET to operate as an amplifier, there is an accompanied expectation for a stable operation to be free of oscillations over a wide frequency range. However, amplifiers using a single FET have a limitation in output power level. For enhancement of amplifier power level, there are amplifiers using parallel connections of two or more FETs.

Such parallel connections of amplifiers have individual amplifiers simply bearing part of entire output power, thus affording to increase synthesized output power without undue burdens on individual amplifiers.

In spite of advantageous possible enhancement of synthesized output power relative to a single FET, parallel-connected FET amplifiers are subject to phenomena of so-called "parallel FET oscillation" or "odd mode oscillation" making them unstable. Such undesirable oscillations are caused by a self-resonant circuit composed of parasitic capacitors in FETs and inductances of wirings for FET connections.

FETs tend to be broken by odd mode oscillation currents owing to such resonant phenomena.

For suppression of such undesirable odd mode oscillations, typical parallel FET amplifiers have a resistor connected in series to gates of parallel FETs for reduction of their gate currents. However, serial connection of a resistor to the gate works to reduce also an input signal to be amplified. Hence, there is a desideratum for parallel FET amplifiers to suppress odd mode oscillations without reduction of an input signal to be amplified.

Figure 1:
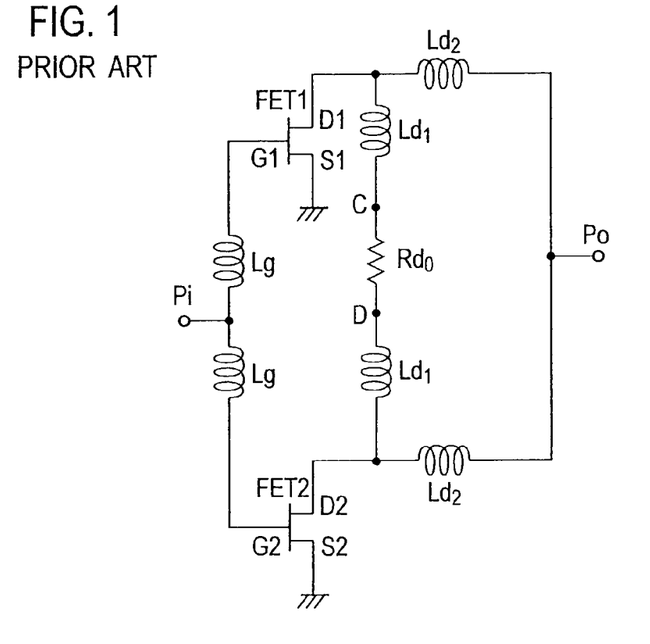
FIG. 1 is an example of circuitry of a semiconductor device in the past, with a drain bypass resistor $Rd_0$ connected between drains of parallelized FETs.
Figure 2:
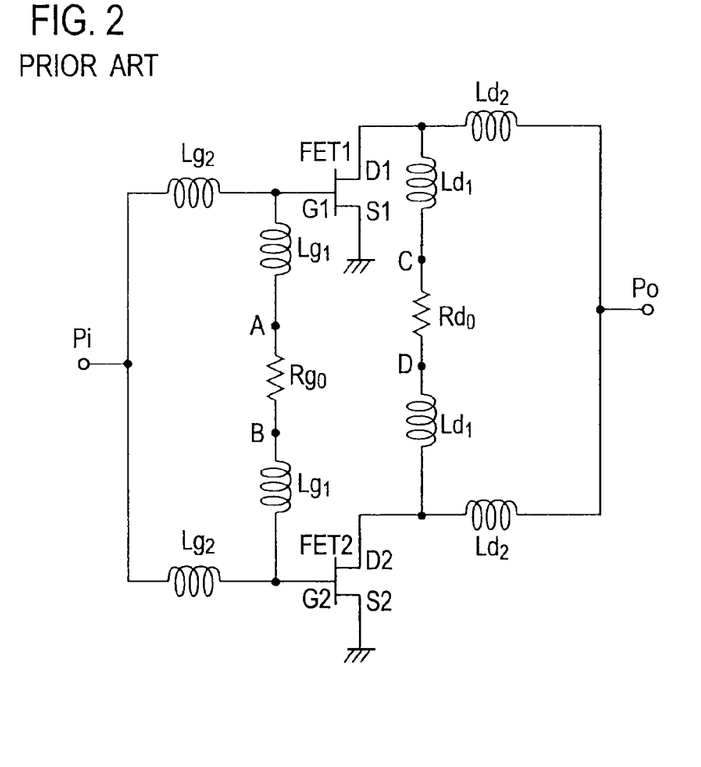
FIG. 2 is an example of circuitry of a semiconductor device in the past, with a gate bypass resistor $Rg_0$ connected between gates, and a drain bypass resistor $Rd_0$ connected between drains of parallelized FETs.

As an example for suppression of odd mode oscillation in a typical parallel FET amplifier, FIG. 1 shows use of a bypass resistor $Rd_0$ connected between drains. Further, as an example for suppression of odd mode oscillation in a typical parallel FET amplifier, FIG. 2 shows combination of a gate bypass resistor $Rg_0$ connected between gates, and a drain bypass resistor $Rd_0$ connected between drains. In FIG. 1 and FIG. 2, designated at G1, D1, and S1 are a gate, a drain, and a source of an FET 1, respectively, and G2, D2, and S2 are a gate, a drain, and a source of an FET 2, respectively. In FIG. 1 and FIG. 2, the sources S1 and S2 are grounded.

For parallelization of the FET 1 and the FET 2 in FIG. 1, the gate G1 of FET 1 and the gate G2 of FET 2 are connected to each other, there being inductors Lg accompanying gate wirings between the gate G1 and an input terminal Pi and between the input terminal Pi and the gate G2.

Likewise, for parallelization of the FET 1 and the FET 2 in FIG. 1, the drain D1 of FET 1 and the drain D2 of FET 2 are connected to each other, there being inductors $Ld_2$ accompanying drain wirings between the drain D1 and an output terminal Po and between the output terminal Po and the drain D2. Further, in FIG. 1, there is a bypass resistor $Rd_o$ connected between the drain D1 of FET 1 and the drain D2 of FET 2 (more specifically, between a node C and a node D), there being inductors $Ld_1$ accompanying associated drain wirings.

For parallelization of the FET 1 and the FET 2 in FIG. 2, the gate G1 of FET 1 and the gate G2 of FET 2 are connected to each other, there being inductors $Lg_2$ accompanying gate wirings between the gate G1 and an input terminal Pi and between the input terminal Pi and the gate G2. Further, in FIG. 2, there is a bypass resistor $Rg_o$ connected between the gate G1 of FET 1 and the gate G2 of FET 2 (more specifically, between a node A and a node B), there being inductors $Lg_i$ accompanying associated drain wirings.

Likewise, for parallelization of the FET 1 and the FET 2 in FIG. 2, the drain D1 of FET 1 and the drain D2 of FET 2 are connected to each other, there being inductors $Ld_2$ accompanying drain wirings between the drain D1 and an output terminal Po and between the output terminal Po and the drain D2. Further, in FIG. 2, there is a bypass resistor $Rd_o$ connected between the drain D1 of FET 1 and the drain D2 of FET 2 (more specifically, between a node C and a node D), there being inductors $Ld_1$ accompanying associated drain wirings.

Generally, individual FETs have device variations in between, so there are potential variations developed between gate potentials or drain potentials of individual FETs. It therefore is difficult to cancel out potential variations between gate potentials or drain potentials of individual FETs, even with a bypass resistor connected between gates or drains of parallelized FETs. Further, in use for power amplification, parallelized FETs with such device variations are susceptive in power synthesis ratio to input frequencies accompanying potential variations.

Further, for parallelization of FETs, there is connection of a parallel circuit composed of a bypass resistor and a bypass inductor between gates and drains, subject to an increase in loss at frequencies of an input to be amplified.

DETAILED DESCRIPTION

There will be description of embodiments with reference to the drawings.

According to an embodiment, there is a semiconductor device comprising a first active element, a second active element connected in parallel with the first active element, and a first stabilization circuit connected between a gate of the first active element and a gate of the second active element, and configured with a parallel circuit of a gate bypass resistor, a gate bypass capacitor, and a gate bypass inductor, wherein the first stabilization circuit has a resonant frequency equal to an odd mode resonant frequency.

According to another embodiment, there is a semiconductor device comprising a combination of a first active element and a second active element connected in parallel to each other and each respectively adapted to have a negative resistance accompanying a high-frequency negative resistance oscillation, a first stabilization circuit connected between a gate of the first active element and a gate of the second active element, and configured with a parallel circuit of a gate bypass resistor, a gate bypass capacitor, and a gate bypass inductor, and a second stabilization circuit connected between a drain of the first active element and a drain of the second active element, and configured with a parallel circuit of a drain bypass resistor, a drain bypass capacitor, and a drain bypass inductor, wherein the first stabilization circuit has a resonant frequency equal to an odd mode resonant frequency, the second stabilization circuit having a resonant frequency equal to a high-frequency negative resistance oscillation frequency.

According to another embodiment, there is a semiconductor device comprising a set of active elements connected in parallel to each other and each respectively adapted to work with a negative resistance accompanying a high-frequency negative resistance oscillation, a first stabilization circuit connected between gates of neighboring active elements of the set of active elements and configured with a parallel circuit of a gate bypass resistor, a gate bypass capacitor, and a gate bypass inductor, and a second stabilization circuit connected between drains of the neighboring active elements of the set of active elements, and configured with a parallel circuit of a drain bypass resistor, a drain bypass capacitor, and a drain bypass inductor, wherein the first stabilization circuit has a resonant frequency equal to an odd mode resonant frequency, the second stabilization circuit having a resonant frequency equal to a frequency of high-frequency negative resistance oscillation.

First Embodiment

Figure 3:
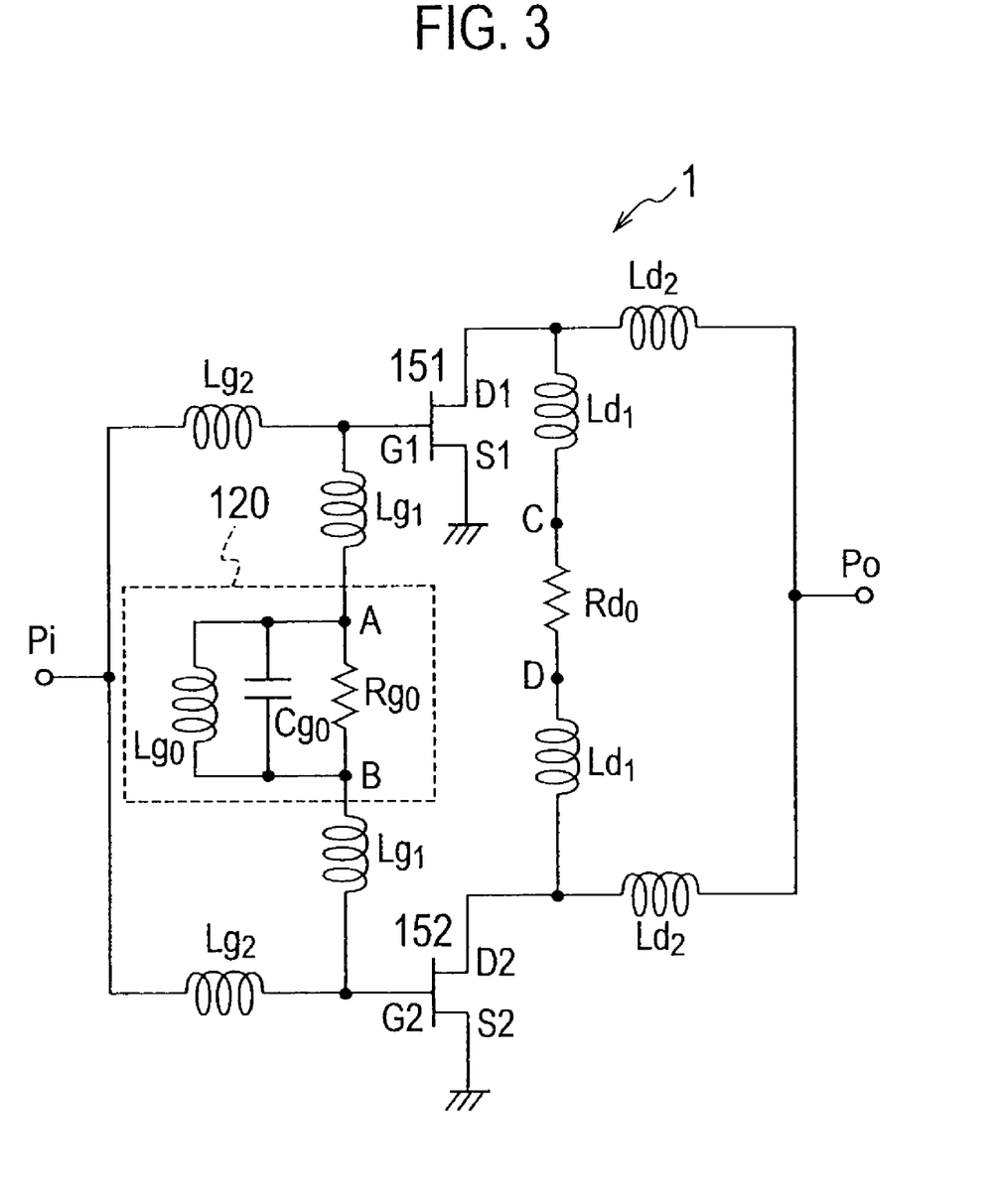
FIG. 3 is a schematic circuit diagram of a semiconductor device according to a first embodiment.

According to a first embodiment, as schematically shown in FIG. 3, there is a semiconductor device 1 configured with circuitry including: combination of a first active element 151, and a second active element 152 to be connected in parallel with the first active element 151; and a first stabilization circuit 120 connected between a gate G1 of the first active element 151 and a gate G2 of the second active element 152 (more specifically, between a node A and a node B), and composed as a parallel circuit of a gate bypass resistor $Rg_0$, a gate bypass capacitor $Cg_0$, and a gate bypass inductor $Lg_0$. The first stabilization circuit 120 has a resonant frequency equal to an odd mode resonance frequency.

The gate bypass capacitor $Cg_0$ may be disposed adjacent to the gate bypass inductor $Lg_0$.

The gate bypass capacitor $Cg_0$ may be disposed adjacent to the gate bypass resistor $Rg_0$.

In FIG. 3, the first active element 151 has the gate, a drain, and a source designated by G1, D1, and S1, respectively, and the second active element 152 has the gate, a drain, and a source designated by G2, D2, and S2, respectively. In FIG. 3, the sources S1 and S2 are grounded.

For parallelization of the first active element 151 and the second active element 152, the gate G1 and the gate G2 are connected to each other, as shown in FIG. 3, there being inductors $Lg_2$ accompanying gate wirings between the gate G1 and an input terminal Pi and between the input terminal Pi and the gate G2. Further, the first stabilization circuit 120 is connected between the gate G1 and the gate G2, as shown in FIG. 3, there being inductors $Lg_1$ accompanying associated gate wirings.

Likewise, for parallelization of the first active element 151 and the second active element 152, the drain D1 and the drain D2 are connected to each other, as shown in FIG. 3, there being inductors $Ld_2$ accompanying drain wirings between the drain D1 and an output terminal Po and between the output terminal Po and the drain D2. Further, there is a drain bypass resistor $Rd_0$ connected between the drain D1 and the drain D2 (more specifically, between a node C and a node D), as shown in FIG. 3, there being inductors $Ld_1$ accompanying associated drain wirings.

(Odd Mode Oscillation)

In circuit configuration shown in FIG. 3, there are two current-conducting loops to appear in the odd mode oscillation. One is a current-conducting loop at the drain side that conducts a current through the first active element 151, from the drain D1 to the source S1, concurrently conducting a current through the second active element 152, from the source S2 to the drain D2. Or else, it conducts a current from the source S1 to the drain D1 of the first active element 151, concurrently conducting a current from the drain D2 to the source S2 of the second active element 152. The other is a current-conducting loop at the gate side that conducts a current through the first active element 151, from the gate G1 to the source S1, concurrently conducting a current through the second active element 152, from the source S2 to the gate G2. Or else, this conducts a current from the source S1 to the gate G1 of the first active element 151, concurrently conducting a current from the gate G2 to the source S2 of the second active element 152.

Such odd mode oscillations are produced at the drain side current-conducting loop or the gate side current-conducting loop, by a self-resonant circuit formed with a combination of parasitic capacities in the first active element 151 and the second active element 152 and wiring inductors in circuits for connection of the first active element 151 and the second active element 152.

(Stabilization Circuit)

FIG. 3 shows the first stabilization circuit 120 applied to the semiconductor device 1 according to the first embodiment. The first stabilization circuit 120 is connected between the gate G1 of the first active element 151 and the gate G2 of the second active element 152, and configured as the parallel circuit of gate bypass resistor $Rg_0$, gate bypass capacitor $Cg_0$, and gate bypass inductor $Lg_0$. The first stabilization circuit 120 has the resonant frequency equal to an odd mode resonance frequency. In other words, there is a resonant frequency depending on the parallel circuit of gate bypass resistor $Rg_0$, gate bypass capacitor $Cg_0$, and gate bypass inductor $Lg_0$ that equals the odd mode resonance frequency.

According to the first embodiment, in the state of odd mode oscillation of the semiconductor device 1, the first stabilization circuit 120 has an equivalent impedance to the gate bypass resistor $Rg_0$, because combination of the gate bypass capacitor $Cg_0$ and the gate bypass inductor $Lg_0$ constitutes a parallel circuit that has a reactance of infinity. This can eliminate odd mode oscillations.

The parallel circuit of gate bypass capacitor $Cg_0$ and gate bypass inductor $Lg_0$ gets short-circuited within a range of frequencies from a dc to an input operational frequency, permitting the gate G1 and the gate G2 to have the same electric potential even with piece-to-piece variations between the first active element 151 and the second active element 152.

The first active element 151 and the second active element 152 can thus be set to a gate potential, affording for element variations if any in between to have suppressed effects on the power synthesis ratio, allowing for stable and highly efficient power amplification.

The first active element 151 and the second active element 152 may be configured with an FET, HEMT, Gunn diode, IMPATT diode, or TUNNETT diode.

More specifically, the first active element 151 and the second active element 152 may be configured with a GaAsMESFET, GaAsHEMT, InPHEMT, or such.

According to the first embodiment having the first stabilization circuit 120 applied to the semiconductor device 1, there is a semiconductor device provided with a suppressed odd mode oscillation allowing for stable and highly efficient power amplification.

(Planar Pattern Configuration)

Figure 4:
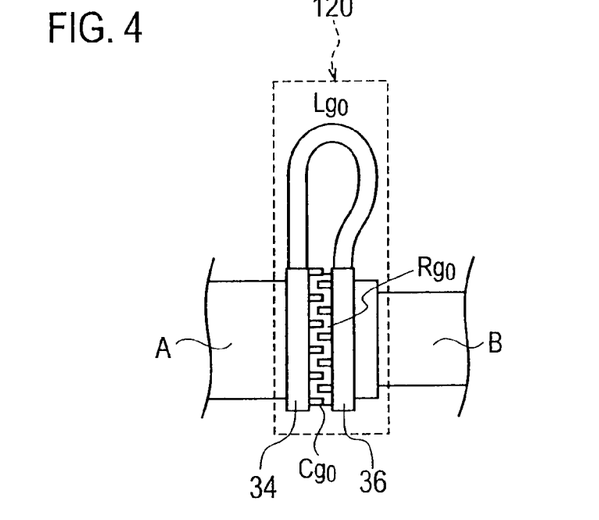
FIG. 4 is a schematic view of a planar pattern configuration of a stabilization circuit applied to the semiconductor device according to the first embodiment.

FIG. 4 schematically shows a planar pattern configuration of a stabilization circuit 120 applied to the semiconductor device 1 according to the first embodiment. This stabilization circuit 120 has, between the gate G1 of the first active element 151 and the gate G2 of the second active element 152 shown in FIG. 3: an R-L circuit composed of a gate bypass resistor $Rg_0$ made up by a thin-film resistor or the like, and a gate bypass inductor $Lg_0$ connected in parallel with the gate bypass resistor $Rg_0$; and a gate bypass capacitor $Cg_0$ formed on the gate bypass resistor $Rg_0$ and connected in parallel with the R-L circuit.

The gate bypass capacitor $Cg_0$ may be disposed adjacent to the gate bypass inductor $Lg_0$, as shown in FIG. 4.

The gate bypass capacitor $Cg_0$ may be disposed as a lamination on the gate bypass resistor $Rg_0$, as shown in FIG. 4. Or else, the gate bypass capacitor $Cg_0$ may be disposed as a lamination under the gate bypass resistor $Rg_0$.

Or otherwise, the gate bypass capacitor $Cg_0$ may have an interdigital capacitor structure configured with a first metallic layer 34, and a second metallic layer 36 disposed adjacent to the first metallic layer 34, as shown in FIG. 4.

The gate bypass inductor $Lg_0$ may be made up by an electrode wiring.

(Configuration of Active Elements)

Figure 5:
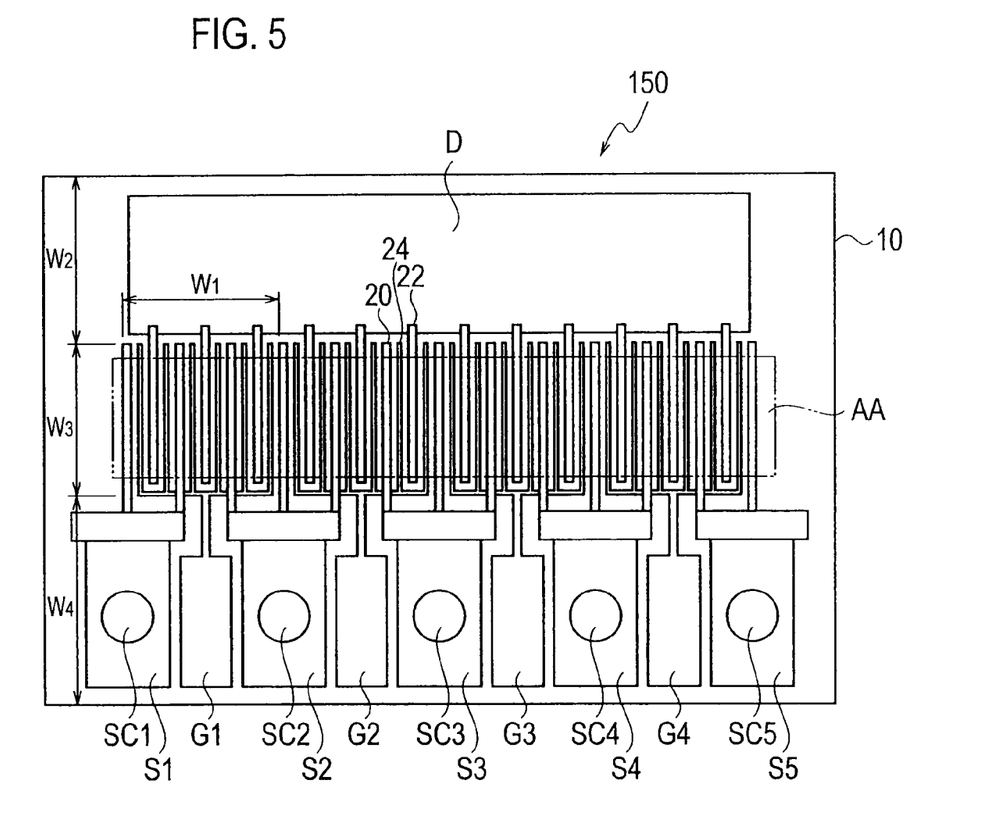
FIG. 5 is a schematic view of a planar pattern configuration of an FET applied to the semiconductor device according to the first embodiment.

FIG. 5 schematically shows an example of planar pattern configuration of an active element 150 applied to the semiconductor device 1 according to the first embodiment. This active element 150 includes: a substrate 10; and combination of a source electrode 20, a drain electrode 22, and a gate electrode 24 each respectively disposed on the substrate 10, and formed with a set of fingers. Further, it includes: combination of a drain terminal electrode D, a set of gate electrode terminals G1, G2, G3, and G4, and a set of source electrode terminals S1, S2, S3, S4, and S5 each respectively disposed on the substrate 10; and a set of via holes SC1, SC2, SC3, SC4, and SC5 for connections to the source electrode terminals S1, S2, S3, S4, and S5, respectively. The drain terminal electrode D is connected with the set of fingers of the drain electrode 22, the gate electrode terminals G1, G2, G3, and G4, with subsets of the set of fingers of the gate electrode 24, respectively, and the source electrode terminals S1, S2, S3, S4, and S5, with subsets of the set of fingers of the source electrode 20, respectively.

On the substrate 10, there is the combination of source electrode 20, drain electrode 22, and gate electrode 24 formed with their sets of fingers grouped or sub-grouped as necessary to constitute the terminal electrodes. The source electrode 20, drain electrode 22, and gate electrode 24 have the sets of fingers arrayed over an area AA configured to be active, as illustrated in FIG. 5.

The example shown in FIG. 5 has the gate electrode terminals G1, G2, G3, and G4 and the source electrode terminals S1, S2, S3, S4, and S5 disposed at one side, and the drain terminal electrode D disposed at the opposite side.

The active area AA is formed in a vicinity of surface of the substrate 10, over an area on the substrate 10 under the source electrode 20, drain electrode 22, and gate electrode 24.

In the example shown in FIG. 5, the substrate 10 has: the source electrode terminals S1, S2, S3, S4, and S5 formed on corresponding areas on a front side thereof vicinal to the active area AA; the via holes SC1, SC2, SC3, SC4, and SC5 formed through them from corresponding locations on a backside thereof; and a ground conductor formed on the backside. For circuit elements to be grounded, there are electrical connections provided through via holes between the ground conductor at the backside of substrate 10 and circuit elements on the front side of substrate 10.

The substrate 10 may be: an SiC substrate; a GaAs substrate; a GaN substrate; a substrate with a GaN epitaxial layer formed on an SiC substrate; a substrate with a GaN epitaxial layer formed on an Si substrate; a substrate with a GaN/AlGaN hetero-junction epitaxial layer formed on an SiC substrate; a substrate with a GaN epitaxial layer formed on a sapphire substrate; a sapphire substrate or diamond substrate; or a semi-insulating substrate.

According to the first embodiment, in the semiconductor device 1, there may be active elements 150 configured each as shown in FIG. 5, for instance, and applied as the first active element 151 and the second active element 152 arranged in parallel with each other, in combination with a first stabilization circuit 120 connected between the gate G1 and the gate G2, as a parallel circuit of a gate bypass resistor $Rg_0$, a gate bypass capacitor $Cg_0$, and a gate bypass inductor $Lg_0$.

(Modified Planar Pattern Configuration of Stabilization Circuit)

Figure 6:
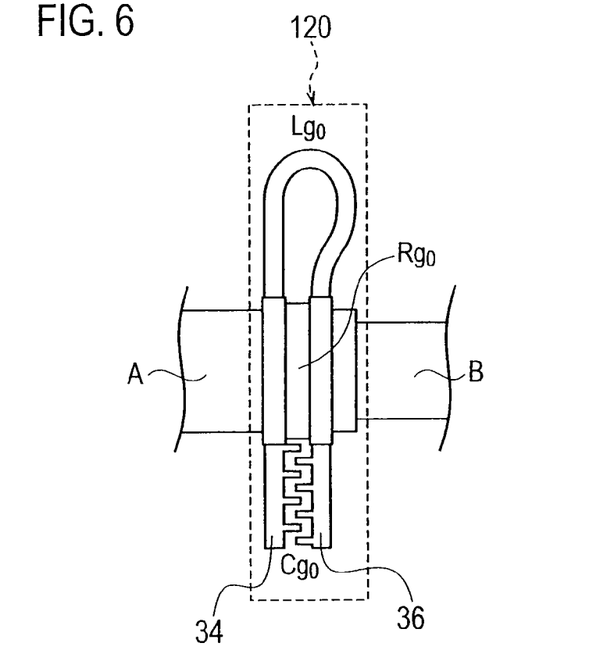
FIG. 6 is a schematic view of a planar pattern configuration of a modified stabilization circuit applied to the semiconductor device according to the first embodiment.

FIG. 6 schematically shows a modified planar pattern configuration of stabilization circuit 120 applied to the semiconductor device 1 according to the first embodiment. This stabilization circuit 120 has: an R-L circuit composed of a resistor $Rg_0$ made up by a thin-film resistor or the like, and an inductor $Lg_0$ connected in parallel with the resistor $Rg_0$; and a capacitor $Cg_0$ disposed adjacent to the resistor $Rg_0$ and connected in parallel with the R-L circuit.

The capacitor $Cg_0$ may have an interdigital capacitor structure configured with a first metallic layer 34, and a second metallic layer 36 disposed adjacent to the first metallic layer 34, as shown in FIG. 6.

The inductor $Lg_0$ may be made up by an electrode wiring.

(Example of Structure of Interdigital Capacitor)

Figure 7:
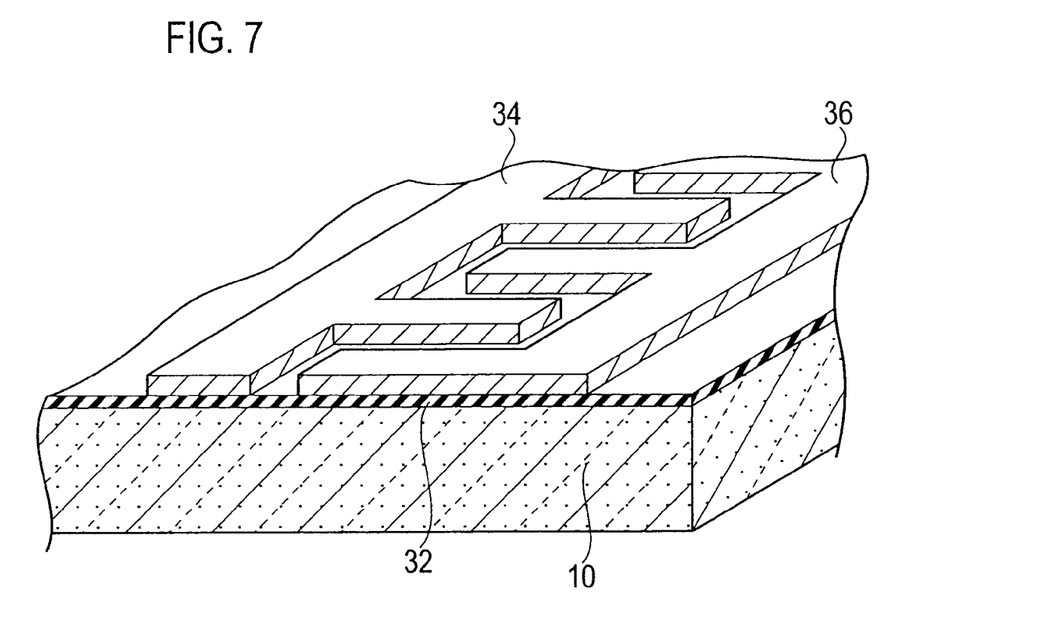
FIG. 7 is a schematic perspective view of configuration of an interdigital capacitor in a stabilization circuit applied to the semiconductor device according to the first embodiment.

FIG. 7 shows an example of structure of interdigital capacitor in a first stabilization circuit 120 applied to the semiconductor device 1 according to the first embodiment. This structure includes: a substrate 10; an insulating layer 32 disposed on the substrate 10; a first metallic layer 34 disposed on the insulating layer 32; and a second metallic layer 36 disposed on the insulating layer 32, adjacent to the first metallic layer 34. The first metallic layer 34 as well as the second metallic layer 36 may be made of aluminum (Al), for instance, and the insulating layer 32 may be made up by e.g. a silicon nitride film, a silicon oxide film, a silicon oxynitride film, or the like. Between the first metallic layer 34 and the second metallic layer 36, there may be an air gap, or an insulation layer such as $SiO_2$ filled in between.

(Example of Structure of Bypass Resistor)

Figure 8:
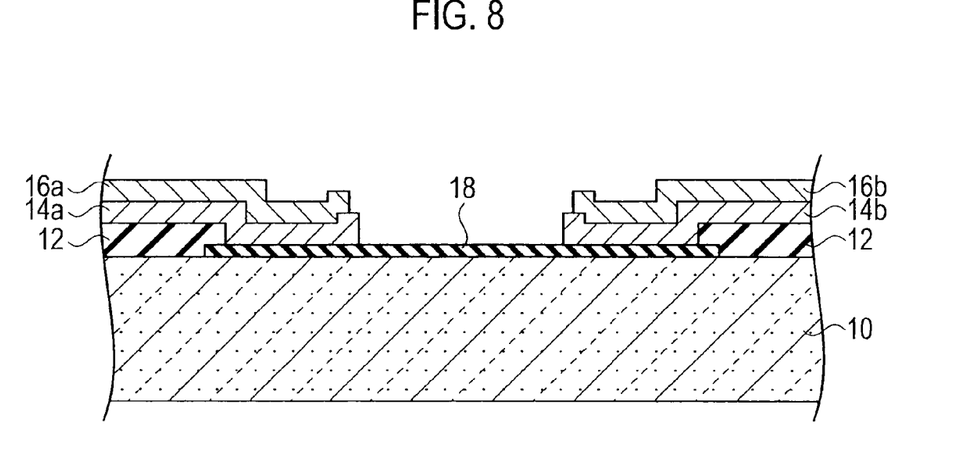
FIG. 8 is a schematic sectional view of configuration of a resistor in a stabilization circuit applied to the semiconductor device according to the first embodiment.

FIG. 8 shows in schematic section an example of structure of bypass resistor in a first stabilization circuit 120 applied to the semiconductor device 1 according to the first embodiment. This structure includes: a substrate 10; a resistor film 18 disposed on the substrate 10; insulation films 12 made up by nitride films or the like and disposed on the substrate 10; metal contact layers 14a and 14b disposed on the insulation films 12, respectively, and configured to contact with the resistor film 18; and metallic layers 16a and 16b connected with the metal contact layers 14a and 14b, respectively. The insulation films 12 may be made up by e.g. silicon nitride films, silicon oxide films, silicon oxynitride films, or the like. The metal contact layers 14a and 14b may be formed with polysilicon layers, for instance, and the metallic layers 16a and 16b may be made of aluminum (Al), for instance.

(Example of Structure of MIM Capacitor)

Figure 9:
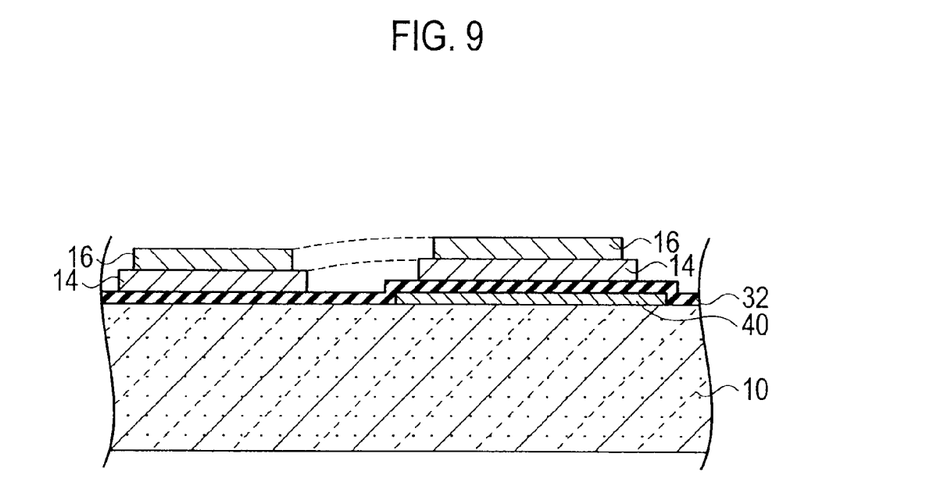
FIG. 9 is a schematic sectional view of configuration of a MIM capacitor in a stabilization circuit applied to the semiconductor device according to the first embodiment.

FIG. 9 shows an example of bypass capacitor $Cg_0$ in a first stabilization circuit 120 applied to the semiconductor device 1 according to the first embodiment. This bypass capacitor $Cg_0$ has a MIM capacitor structure configured with a third metallic layer 40, an insulation layer 32 disposed on the third metallic layer 40, and a metal contact layer 14 disposed on the insulation layer 32.

More specifically, FIG. 9 shows in schematic section an example of structure of MIM capacitor in a first stabilization circuit 120 applied to the semiconductor device 1 according to the first embodiment. This MIM capacitor structure is configured with: a substrate 10; the third metallic layer 40 disposed on the substrate 10; the insulation layer 32 disposed on the substrate 10 and the third metallic layer 40; the metal contact layer 14 disposed on the insulation layer 32; and a metallic layer 16 disposed on the metal contact layer 14. There is a MIM capacitor structure in the form of third metallic layer 40/insulation layer 32/metal contact layer 14 and metallic layer 16.

According to the first embodiment, there is a semiconductor device provided with a suppressed odd mode oscillation allowing for stable and highly efficient power amplification.

Second Embodiment

Figure 10:
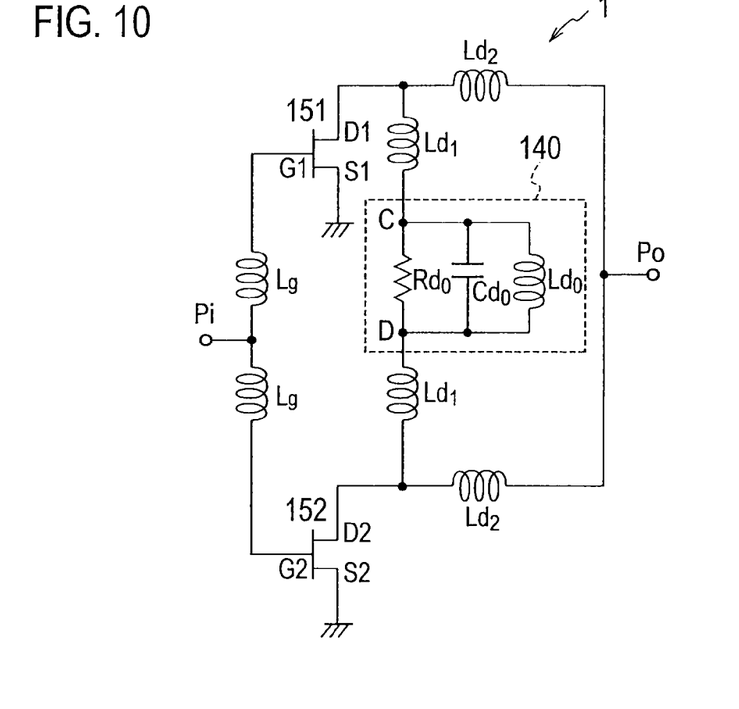
FIG. 10 is a schematic circuit diagram of a semiconductor device according to a second embodiment.

According to a second embodiment, as schematically shown in FIG. 10, there is a semiconductor device 1 configured with circuitry including: combination of a first active element 151 and a second active element 152 each respectively adapted to work with a negative resistance accompanying a high-frequency negative resistance oscillation; and a second stabilization circuit 140 connected between a drain D1 of the first active element 151 and a drain D2 of the second active element 152 (more specifically, between a node C and a node D), and composed as a parallel circuit of a drain bypass resistor $Rd_0$, a drain bypass capacitor $Cd_0$, and a drain bypass inductor $Ld_0$. The second stabilization circuit 140 has a resonant frequency equal to a high-frequency negative resistance oscillation frequency.

The second stabilization circuit 140 is adapted for cancellation of negative resistance.

There may be a high-frequency negative resistance oscillation developed as a Gunn oscillation, for instance.

The drain bypass capacitor $Cd_0$ may be disposed adjacent to the drain bypass inductor $Ld_0$.

The drain bypass capacitor $Cd_0$ may be disposed adjacent to the drain bypass resistor $Rd_0$.

In FIG. 10, the first active element 151 has a gate, the drain, and a source designated by G1, D1, and S1, respectively, and the second active element 152 has a gate, the drain, and a source designated by G2, D2, and S2, respectively. In FIG. 10, the sources S1 and S2 are grounded.

For parallelization of the first active element 151 and the second active element 152, the gate G1 and the gate G2 are connected to each other, as shown in FIG. 10, there being inductors Lg accompanying gate wirings between the gate G1 and an input terminal Pi and between the input terminal Pi and the gate G2.

Likewise, for parallelization of the first active element 151 and the second active element 152, the drain D1 and the drain D2 are connected to each other, as shown in FIG. 10, there being inductors $Ld_2$ accompanying drain wirings between the drain D1 and an output terminal Po and between the output terminal Po and the drain D2. Further, the second stabilization circuit 140 is connected between the drain D1 and the drain D2, as shown in FIG. 10, there being inductors $Ld_1$ accompanying associated drain wirings.

(Stabilization Circuit)

FIG. 10 shows the second stabilization circuit 140 applied to the semiconductor device 1 according to the second embodiment. The second stabilization circuit 140 is connected between the drain D1 of the first active element 151 and the drain D2 of the second active element 152, and configured as the parallel circuit of drain bypass resistor $Rd_0$, drain bypass capacitor $Cd_0$, and drain bypass inductor $Ld_0$. The second stabilization circuit 140 has the resonant frequency equal to an oscillation frequency of high-frequency negative resistance oscillation. In other words, there is a resonant frequency depending on the parallel circuit of drain bypass resistor $Rd_0$, drain bypass capacitor $Cd_0$, and drain bypass inductor $Ld_0$ that equals the oscillation frequency of high-frequency negative resistance oscillation.

According to the second embodiment, in the state of high-frequency negative resistance oscillation of the semiconductor device 1, the second stabilization circuit 140 has an equivalent impedance to the drain bypass resistor $Rd_0$, because combination of the drain bypass capacitor $Cd_0$ and the drain bypass inductor $Ld_0$ constitutes a parallel circuit that has a reactance of infinity. The drain bypass resistor $Rd_0$ can be set to an equivalent resistance to the negative resistance, thus permitting the second stabilization circuit 140 to cancel the negative resistance.

There may be a high-frequency negative resistance oscillation developed as a Gunn oscillation, for instance.

(Results of Simulation)

Figure 11:
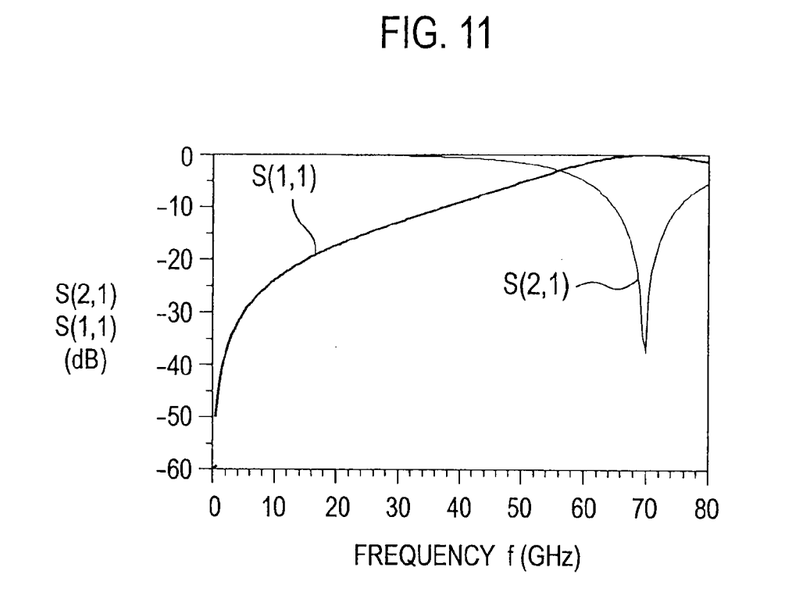
FIG. 11 shows simulation results of a semiconductor device according to the second embodiment.

FIG. 11 shows, in a graph, simulation results of a semiconductor device 1 according to the second embodiment. The axis of abscissas represents frequencies f in GHz, and the axis of ordinate represents S-parameters in terms of S(1,1) dB and S(2,1) dB. There were conditions assumed, including an input frequency of 10 GHz, a Gunn oscillation frequency of 70 GHz, a drain bypass capacitor $Cd_0$ of 0.14 pF, a drain bypass inductor $Ld_0$ of 0.05 nH, and a resonant frequency of 70 GHz for a second stabilization circuit 140.

The simulation showed an L-C circuit composed of the drain bypass capacitor $Cd_0$ and the drain bypass inductor $Ld_0$, resonating at an odd mode frequency, getting short-circuited over a frequency range from a dc to an input frequency. For the Gunn oscillation frequency sufficiently higher than the input frequency, there was an open state of the L-C circuit composed of the drain bypass capacitor $Cd_0$ and the drain bypass inductor $Ld_0$. As proven, there was successful use of a drain bypass resistor $Rd_0$ for elimination of a negative resistance at the frequency of Gunn oscillation, to suppress the Gunn oscillation.

The second stabilization circuit 140 has an LC parallel circuit configured to resonate at a Gunn oscillation frequency, providing an infinite reactance, and is adapted to provide a positive resistance. Hence, in the semiconductor device 1 according to the second embodiment, there is use of a second stabilization circuit 140 configured for elimination of a negative resistance at a frequency of Gunn oscillation, to suppress the Gunn oscillation.

There may be a first active element 151 or a second active element 152 configured as an FET, a HEMT, a Gunn diode, an IMPATT diode, or a TUNNETT diode.

More specifically, three may be a first active element 151 or a second active element 152 configured as a GaAsMES FET, a GaAsHEMT, an InPHEMT, or such.

In the semiconductor device 1 according to the second embodiment, there is use of a second stabilization circuit 140 configured to suppress a negative resistance accompanying a high-frequency negative resistance oscillation, allowing for provision of a semiconductor device adapted for stable power amplification with an enhanced efficiency.

According to the second embodiment, the second stabilization circuit 140 applied to the semiconductor device 1 has a planar pattern configured like that schematically shown in FIG. 4, and redundant description thereof is omitted.

The drain bypass capacitor $Cd_0$ may be disposed adjacent to the drain bypass inductor $Ld_0$, like that in FIG. 4.

The drain bypass capacitor $Cd_0$ may be disposed as a lamination on the drain bypass resistor $Rd_0$, like that in FIG. 4. Or else, the drain bypass capacitor $Cd_0$ may be disposed as a lamination under the drain bypass resistor $Rd_0$.

Or otherwise, the drain bypass capacitor $Cd_0$ may have an interdigital capacitor structure configured with a first metallic layer 34, and a second metallic layer 36 disposed adjacent to the first metallic layer 34, like that in FIG. 4.

The drain bypass inductor $Ld_0$ may be made up by an electrode wiring.

According to the second embodiment, the active elements 151 and 152 applied to the semiconductor device 1 each have a planar pattern configured like that schematically shown in FIG. 5, and redundant description thereof is omitted.

According to the second embodiment, the second stabilization circuit 140 applied to the semiconductor device 1 has a modified planar pattern configured like that schematically shown in FIG. 6, and redundant description thereof is omitted.

According to the second embodiment, the second stabilization circuit 140 applied to the semiconductor device 1 has an interdigital capacitor structure configured like that shown in FIG. 7, and redundant description thereof is omitted.

According to the second embodiment, the second stabilization circuit 140 applied to the semiconductor device 1 has the drain bypass resistor $Rd_o$ configured in section like that schematically shown in FIG. 8, and redundant description thereof is omitted.

According to the second embodiment, the second stabilization circuit 140 applied to the semiconductor device 1 has a MIM capacitor structure configured like that shown in FIG. 9, and redundant description thereof is omitted.

According to the second embodiment, there is a semiconductor device provided with a suppressed negative resistance accompanying a Gunn oscillation, allowing for stable power amplification with an enhanced efficiency.

Third Embodiment

Figure 12:
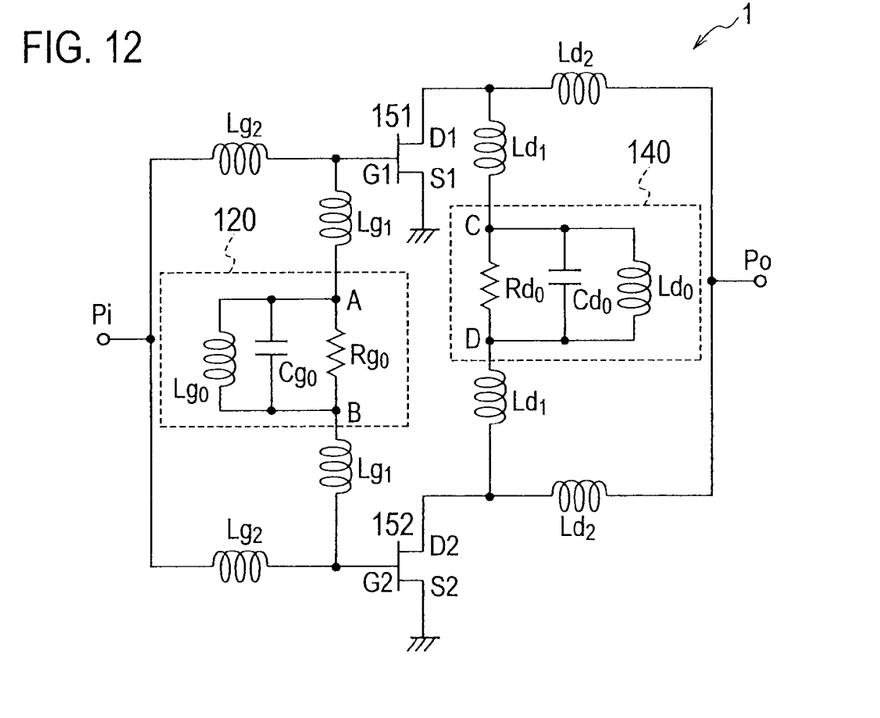
FIG. 12 is a schematic circuit diagram of a semiconductor device according to a third embodiment.

According to a third embodiment, as schematically shown in FIG. 12, there is a semiconductor device 1 configured with circuitry including: combination of a first active element 151 and a second active element 152 each respectively adapted to work with a negative resistance accompanying a high-frequency negative resistance oscillation; a first stabilization circuit 120 connected between a gate G1 of the first active element 151 and a gate G2 of the second active element 152 (more specifically, between a node A and a node B), and composed as a parallel circuit of a gate bypass resistor $Rg_0$, a gate bypass capacitor $Cg_0$, and a gate bypass inductor $Lg_0$; and a second stabilization circuit 140 connected between a drain D1 of the first active element 151 and a drain D2 of the second active element 152 (more specifically, between a node C and a node D), and composed as a parallel circuit of a drain bypass resistor $Rd_0$, a drain bypass capacitor $Cd_0$, and a drain bypass inductor $Ld_0$. The first stabilization circuit 120 has a resonant frequency equal to an odd mode resonance frequency. The second stabilization circuit 140 has a resonant frequency equal to a high-frequency negative resistance oscillation frequency.

The second stabilization circuit 140 is adapted for cancellation of negative resistance.

There may be a high-frequency negative resistance oscillation developed as a Gunn oscillation, for instance.

According to the third embodiment, the semiconductor device 1 is configured with circuitry including, among others, parasitic inductors accompanying associated wirings, the active elements 151 and 152 having their planar patterns, and the first and second stabilization circuits 120 and 140 having their planar patterns adapted for stable performances, interdigital capacitor structures, bypass resistor structures, and MIM capacitor structures, as being identical or similar to corresponding ones of the semiconductor device according to the first embodiment and the semiconductor device according to the second embodiment, and redundant description thereof is omitted.

(Modification)

Figure 13:
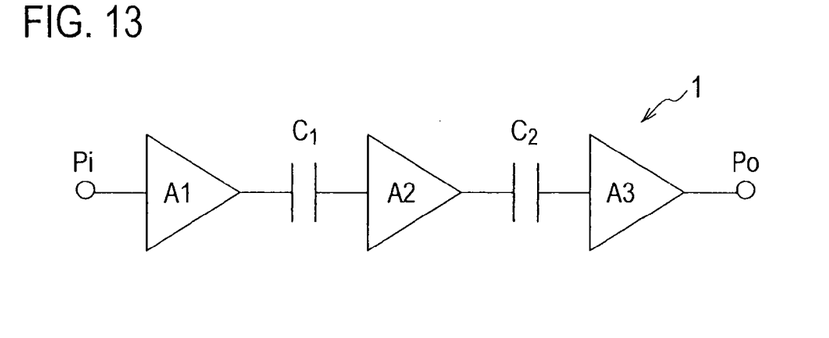
FIG. 13 is a schematic circuit block diagram of a semiconductor device according to a modification of the third embodiment.

The third embodiment may be modified by expanding the configuration of circuitry of semiconductor device shown in FIG. 12. FIG. 13 shows a semiconductor device 1 according to a modification of the third embodiment. This semiconductor device 1 is configured with multi-staged circuitry including: a first amplifier A1 connected at an input end thereof to an input terminal Pi of the semiconductor device 1; a second amplifier A2 coupled at an input end thereof by a first capacitor $C_1$ with an output end of the first amplifier A1; and a third amplifier A3 coupled at an input end thereof by a second capacitor $C_2$ with an output end of the second amplifier A2, and connected at an output end thereof to an output terminal Po of the semiconductor device 1.

Figure 14:
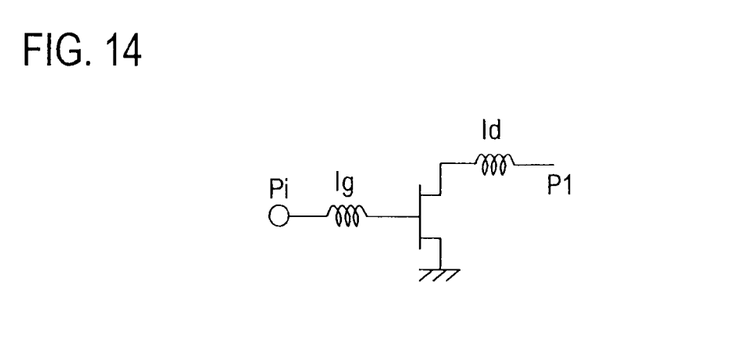
FIG. 14 is a schematic circuit diagram of an amplifier A1 at a first stage in the semiconductor device according to the modification of the third embodiment.

FIG. 14 shows circuitry of the first amplifier A1 including a single FET provided with a gate inductor lg and a drain inductor ld, and connected between the input terminal Pi and a single connection terminal P1.

Figure 15:
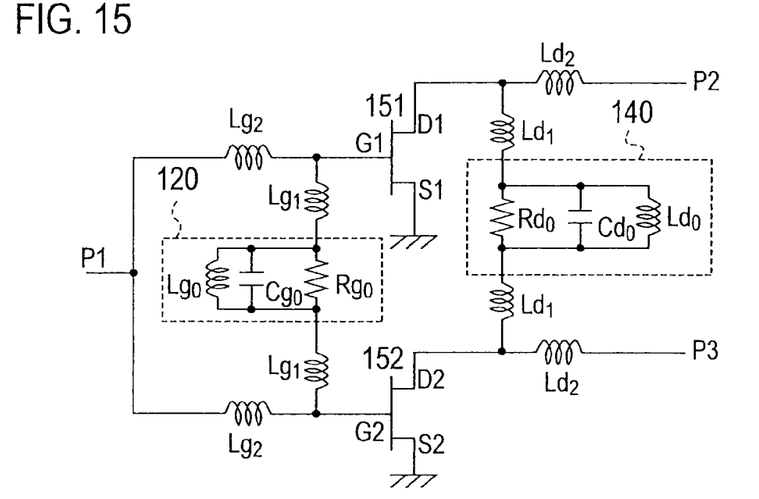
FIG. 15 is a schematic circuit diagram of an amplifier A2 at a second stage in the semiconductor device according to the modification of the third embodiment.

FIG. 15 shows circuitry of the second amplifier A2 including: combination of a first active element 151 and a second active element 152 connected in parallel with each other between the connection terminal P1 and a pair of connection terminals P2 and P3, and each respectively adapted to work with a negative resistance accompanying a high-frequency negative resistance oscillation; a first stabilization circuit 120 connected between a gate G1 of the first active element 151 and a gate G2 of the second active element 152, and composed as a parallel circuit of a gate bypass resistor $Rg_0$, a gate bypass capacitor $Cg_0$, and a gate bypass inductor $Lg_0$; and a second stabilization circuit 140 connected between a drain D1 of the first active element 151 and a drain D2 of the second active element 152, and composed as a parallel circuit of a drain bypass resistor $Rd_0$, a drain bypass capacitor $Cd_0$, and a drain bypass inductor $Ld_0$. The first stabilization circuit 120 has a resonant frequency equal to an odd mode resonance frequency. The second stabilization circuit 140 has a resonant frequency equal to a high-frequency negative resistance oscillation frequency.

Figure 16:
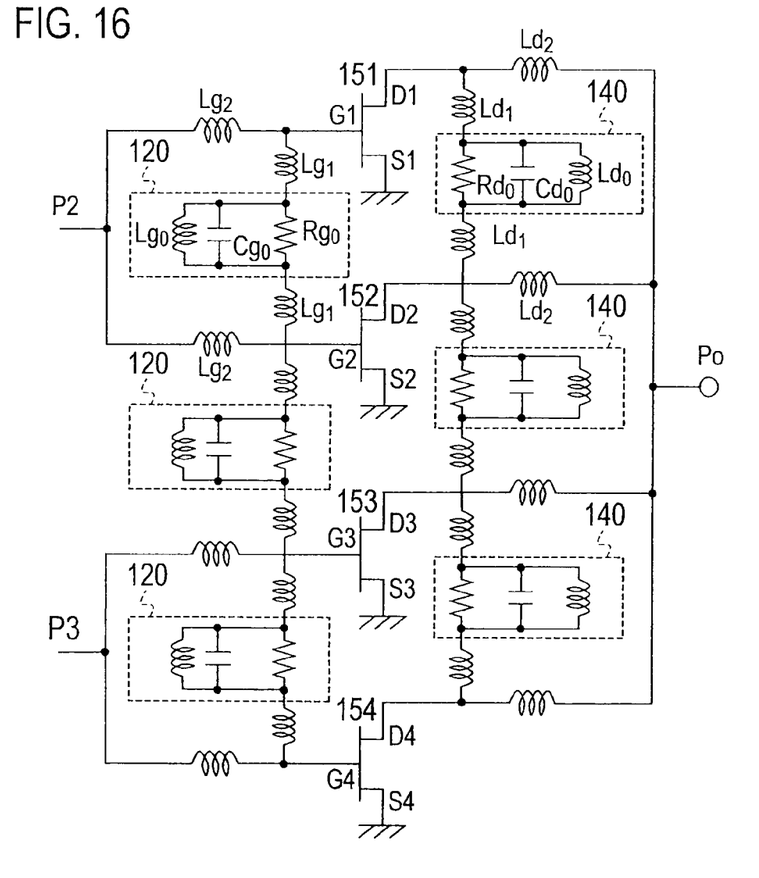
FIG. 16 is a schematic circuit diagram of an amplifier A3 at a third stage in the semiconductor device according to the modification of the third embodiment.

FIG. 16 shows circuitry of the third amplifier A3 including: a set of a first pair of active elements 151 and 152 connected in parallel with each other between the connection terminal P2 and the output terminal Po and each respectively adapted to work with a negative resistance accompanying a high-frequency negative resistance oscillation, and a second pair of active elements 153 and 154 connected in parallel with each other between the connection terminal P3 and the output terminal Po and each respectively adapted to work with a negative resistance accompanying a high-frequency negative resistance oscillation; a first set of stabilization circuits 120 each respectively connected between gates G1 and G2, G2 and G3, or G3 and G4 of neighboring active elements 151 and 152, 152 and 153, or 153 and 154, and composed as a parallel circuit of a gate bypass resistor $Rg_0$, a gate bypass capacitor $Cg_0$, and a gate bypass inductor $Lg_0$; and a second set of stabilization circuits 140 each respectively connected between drains D1 and D2, D2 and D3, or D3 and D4 of the neighboring active elements 151 and 152, 152 and 153, or 153 and 154, and composed as a parallel circuit of a drain bypass resistor $Rd_0$, a drain bypass capacitor $Cd_0$, and a drain bypass inductor $Ld_0$. Like the third embodiment, the stabilization circuits 120 each have a resonant frequency equal to an odd mode resonance frequency, and the stabilization circuits 140 each have a resonant frequency equal to a high-frequency negative resistance oscillation frequency.

In operation as an amplifier, there is an expectation for a stable performance free of oscillations over a wide frequency range. Instead of an amplifier using a single FET with a limitation in output power, there is a configuration of amplifier using parallel connection of two or more staged FETs for enhancement in power level of amplifier, like the modification of the third embodiment affording for individual FETs to bear simply part of entire output power, allowing for an enhanced synthesis power output without undue burdens on individual FETs.

According to the modification of the third embodiment, there is possible suppression of both odd mode oscillation and high-frequency negative resistance oscillation in a multi-staged configuration of FET amplifier, allowing for an enhanced synthesis output power, as an advantage relative to a single FET.

According to the third embodiment, as well as the modification thereof, there is combination of features of a first stabilization circuit 120 according to the first embodiment and a second stabilization circuit 140 according to the second embodiment, allowing for suppression of both odd mode oscillation and high-frequency negative resistance oscillation.

That is, there is a resonant frequency determined in dependence on a parallel circuit of a gate bypass capacitor $Cg_0$ and a gate bypass inductor $Lg_0$, to be equal to an odd mode resonant frequency. According to the modification of the third embodiment, in a state of odd mode oscillation of semiconductor device, the parallel circuit of gate bypass capacitor $Cg_0$ and gate bypass inductor $Lg_0$ has a reactance value of infinity depending thereon, thus providing the first stabilization circuit 120 with an equivalent impedance to a gate bypass resistor $Rg_0$, affording to stop odd mode oscillation.

The parallel circuit of gate bypass capacitor $Cg_0$ and gate bypass inductor $Lg_0$ becomes short-circuited within a frequency range from a dc to input operation frequencies, permitting a set of active elements in use to have an even gate potential, even with device variations among active elements, thus affording to suppress influences of device variations, if any, on the power synthesis ratio, allowing for stable power amplification with an enhanced efficiency.

Further, there is a second stabilization circuit 140 adapted to have a resonant frequency equal to a frequency of high-frequency negative resistance oscillation. That is, there is a resonant frequency determined in dependence on a parallel circuit of a drain bypass capacitor $Cd_0$ and a drain bypass inductor $Ld_0$, to be equal to the high-frequency negative resistance oscillation frequency. According to the modification of the third embodiment, in a state of high-frequency negative resistance oscillation of semiconductor device, the parallel circuit of drain bypass capacitor $Cd_0$ and drain bypass inductor $Ld_0$ has a reactance value of infinity depending thereon, thus providing the second stabilization circuit 140 with an equivalent impedance to a drain bypass resistor $Rd_0$. The drain bypass resistor $Rd_0$ may thus have an equivalent resistance in absolute value to a negative resistance, allowing for cancellation of the negative resistance by the second stabilization circuit 140.

According to the third embodiment, as well as the modification thereof, there is a semiconductor device adapted to suppress an odd mode oscillation, suppressing a negative resistance accompanying the Gunn oscillation, thus allowing for stable power amplification with an enhanced efficiency.

According to certain embodiments, there may well be a semiconductor device using an amplification element configured not simply as an FET or a HEMT, but also as a LDMOS (Laterally Diffused Metal-Oxide-Semiconductor Field Effect Transistor), or an HBT (Hetero-junction Bipolar Transistor), or a MEMS (Micro Electro Mechanical Systems) or the like.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a first active element;
    a second active element connected in parallel with the first active element; and
    a first stabilization circuit connected between a gate of the first active element and a gate of the second active element, and configured with a parallel circuit of a gate bypass resistor, a gate bypass capacitor, and a gate bypass inductor, wherein
    the first stabilization circuit has a resonant frequency equal to an odd mode resonant frequency.

2. The semiconductor device according to claim 1, wherein the gate bypass capacitor is disposed adjacent to the gate bypass inductor.

3. The semiconductor device according to claim 1, wherein the gate bypass capacitor is disposed adjacent to the gate bypass resistor.

4. The semiconductor device according to claim 1, wherein the gate bypass capacitor is disposed as a lamination over the gate bypass resistor.

5. The semiconductor device according to claim 1, wherein the gate bypass capacitor is disposed as a lamination under the gate bypass resistor.

6. The semiconductor device according to claim 1, wherein the gate bypass capacitor has an interdigital capacitor structure comprising a first metallic layer, and a second metallic layer disposed adjacent to the first metallic layer.

7. The semiconductor device according to claim 1, wherein the gate bypass capacitor has a MIM capacitor structure comprising a third metallic layer, an insulation layer disposed on the third metallic layer, and a metal contact layer disposed on the insulation layer.

8. The semiconductor device according to claim 1 further comprising:
    a combination of the first active element and the second active element connected in parallel to each other and each respectively adapted to have a negative resistance accompanying a high-frequency negative resistance oscillation; and
    a second stabilization circuit connected between a drain of the first active element and a drain of the second active element, and configured with a parallel circuit of a drain bypass resistor, a drain bypass capacitor, and a drain bypass inductor, wherein
    the second stabilization circuit has a resonant frequency equal to a frequency of the high-frequency negative resistance oscillation.

9. The semiconductor device according to claim 8, wherein the second stabilization circuit is configured to cancel the negative resistance.

10. The semiconductor device according to claim 8, wherein the high-frequency negative resistance oscillation is a Gunn oscillation.

11. The semiconductor device according to claim 8, wherein the drain bypass capacitor is disposed adjacent to the drain bypass inductor.

12. The semiconductor device according to claim 8, wherein the drain bypass capacitor is disposed adjacent to the drain bypass resistor.

13. The semiconductor device according to claim 8, wherein the drain bypass capacitor is disposed as a lamination over the drain bypass resistor.

14. The semiconductor device according to claim 8, wherein the drain bypass capacitor is disposed as a lamination under the drain bypass resistor.

15. The semiconductor device according to claim 8, wherein the drain bypass capacitor has an interdigital capacitor structure comprising a first metallic layer, and a second metallic layer disposed adjacent to the first metallic layer.

16. The semiconductor device according to claim 8, wherein the drain bypass capacitor has a MIM capacitor structure comprising a third metallic layer, an insulation layer disposed on the third metallic layer, and a metal contact layer disposed on the insulation layer.

17. The semiconductor device according to claim 8, wherein either of the first active element and the second active element comprises a field effect transistor, a high electron mobility transistor, a Gunn diode, an IMPATT diode, or a TUNNETT diode.

18. The semiconductor device according to claim 8, wherein either of the first active element and the second active element comprises a field effect transistor comprising:
    a substrate;
    a combination of a gate electrode configured with a set of fingers thereof, a source electrode configured with a set of fingers thereof, and a drain electrode configured with a set of fingers thereof, the combination of the gate electrode, the source electrode, and the drain electrode being disposed on the substrate;
    a combination a gate terminal electrode configured with a subset of the set of fingers of the gate electrode, a source terminal electrode, configured with a subset of the set of fingers of the source electrode, and a drain terminal electrode configured with a subset of the set of fingers of the drain electrode; and
    a via hole connected to the source terminal electrode.

* * * * *